(12) United States Patent
Wang et al.

(10) Patent No.: US 11,069,660 B2
(45) Date of Patent: Jul. 20, 2021

(54) DISPLAY DEVICE

(71) Applicant: Au Optronics Corporation, Hsinchu (TW)

(72) Inventors: Yu-Ching Wang, Hsinchu (TW); Yi-Hui Lin, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/522,663

(22) Filed: Jul. 26, 2019

(65) Prior Publication Data

US 2020/0258864 A1 Aug. 13, 2020

(30) Foreign Application Priority Data

Feb. 12, 2019 (TW) ................................. 108104628

(51) Int. Cl.
*H01L 25/065* (2006.01)
*H01L 25/18* (2006.01)
*H01L 27/15* (2006.01)
*H01L 27/32* (2006.01)
(Continued)

(52) U.S. Cl.
CPC .......... *H01L 25/0657* (2013.01); *H01L 25/18* (2013.01); *H01L 27/156* (2013.01); *H01L 27/3211* (2013.01); *H01L 27/3246* (2013.01); *H01L 27/3293* (2013.01); *H01L 51/0096* (2013.01); *H01L 51/5218* (2013.01);
(Continued)

(58) Field of Classification Search
CPC ... H01L 25/0657; H01L 25/18; H01L 27/156; H01L 27/3211; H01L 27/3246; H01L 27/3293; H01L 51/0096; H01L 51/5218; H01L 51/5221; H01L 2251/5315; H01L 51/525; H01L 27/326; H01L 51/5225; H01L 25/048; H01L 27/3213; H01L 51/5012; H01L 51/5281; H01L 51/52
See application file for complete search history.

(56) References Cited

U.S. PATENT DOCUMENTS

2010/0176719 A1 7/2010 Hirakata et al.
2016/0014882 A1 1/2016 Jongman et al.
(Continued)

FOREIGN PATENT DOCUMENTS

CN 103293774 9/2013

*Primary Examiner* — Su C Kim
(74) *Attorney, Agent, or Firm* — JCIPRNET

(57) ABSTRACT

A display device includes a first substrate, a first active element layer, first to third light-emitting elements, a first pixel defining layer, and fourth to sixth light-emitting elements. The first active element layer is disposed on the first substrate. The first, second and third light-emitting elements are electrically connected with the first active element layer. The first, second and third light-emitting elements have first, second and third light-emitting layers respectively. The first pixel defining layer is disposed on the first active element layer and has first, second and third openings. The first, second and third light-emitting layers are disposed in the first, second and third openings respectively. The fourth, fifth and sixth light-emitting elements are disposed on the first pixel defining layer. A vertical distance between the first light-emitting element and the fourth light-emitting element is greater than 0 micrometers and less than or equal to 5 micrometers.

12 Claims, 8 Drawing Sheets

(51) Int. Cl.
 *H01L 51/00* (2006.01)
 *H01L 51/52* (2006.01)
(52) U.S. Cl.
 CPC .......... *H01L 51/5221* (2013.01); *H01L 51/52* (2013.01); *H01L 2251/5315* (2013.01)

(56) References Cited

U.S. PATENT DOCUMENTS

| | | | |
|---|---|---|---|
| 2016/0027859 A1* | 1/2016 | Kim | H01L 25/048 257/88 |
| 2016/0233458 A1* | 8/2016 | Shen | H01L 27/3211 |
| 2017/0155075 A1* | 6/2017 | Bi | H01L 51/525 |

* cited by examiner

DISPLAY DEVICE

CROSS-REFERENCE TO RELATED APPLICATION

This application claims the priority benefit of Taiwan application serial no. 108104628, filed on Feb. 12, 2019. The entirety of the above-mentioned patent application is hereby incorporated by reference herein and made a part of this specification.

BACKGROUND OF THE INVENTION

1. Field of the Invention

The invention relates to a display device, and more particularly, to a display device having light-emitting elements disposed on a pixel defining layer.

2. Description of Related Art

At present, augmented reality and virtual reality are mainly implemented by head-mounted displays. In order to enhance the user's immersion in the augmented reality or virtual reality, pictures displayed by a display device need to be sufficiently realistic without noticeable graininess on the pictures.

In the conventional display device, due to limitations in the process technology, it is difficult to reduce a spacing between the light-emitting elements, and the pictures displayed by the display device are likely to have noticeable graininess when being viewed at a close distance. Accordingly, there is an urgent need for a solution to the above problem.

SUMMARY OF THE INVENTION

The invention provides a display device that can solve the problem of noticeable graininess on the pictures.

At least one embodiment of the invention provides a display device. The display device includes a first substrate, a first active element layer, a first light-emitting element, a second light-emitting element, a third light-emitting element, a first pixel defining layer, a fourth light-emitting element, a fifth light-emitting element, and a sixth light-emitting element. The first active element layer is disposed on the first substrate. The first, second and third light-emitting elements are electrically connected with the first active element layer. The first, second and third light-emitting elements have first, second and third light-emitting layers respectively. The first pixel defining layer is disposed on the first active element layer and has first, second and third openings. The first, second and third light-emitting layers are disposed in the first, second and third openings respectively. The fourth, fifth and sixth light-emitting elements are disposed on the first pixel defining layer. The fourth, fifth and sixth light-emitting elements have fourth, fifth and sixth light-emitting layers respectively. The second light-emitting element is disposed between the fourth light-emitting element and the fifth light-emitting element, and the third light-emitting element is disposed between the fifth light-emitting element and the sixth light-emitting element. A vertical distance between the first light-emitting element and the fourth light-emitting element is greater than 0 micrometers and less than or equal to 5 micrometers.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
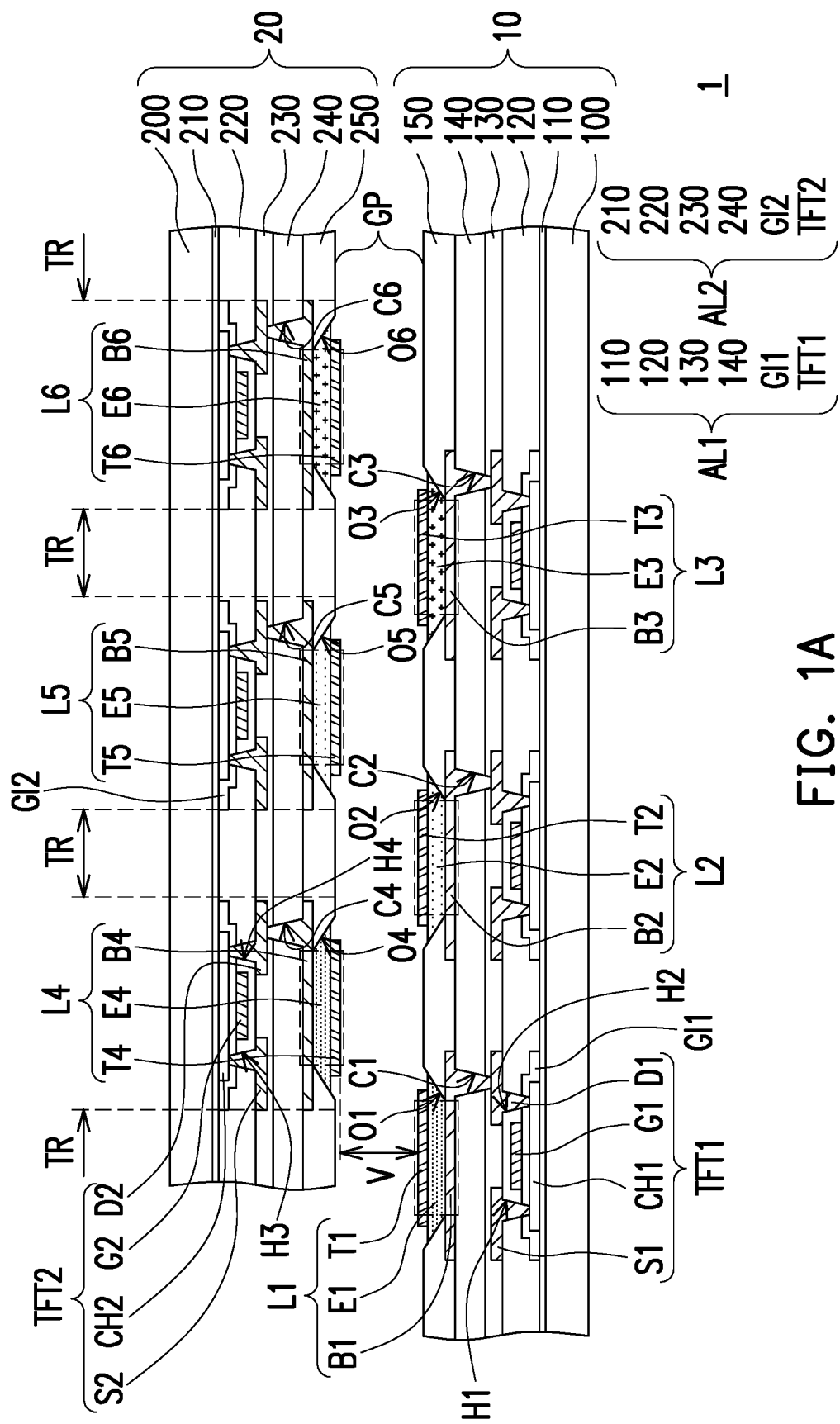
FIG. 1A is a cross-sectional view of a display device according to an embodiment of the invention.

Reference will now be made in detail to the present preferred embodiments of the disclosure, examples of which are illustrated in the accompanying drawings. Wherever possible, the same reference numbers are used in the drawings and the description to refer to the same or like parts.

Herein, a range indicated by the wording "between a numerical value and another numerical value" is a schematic representation used to avoid listing all of the numerical values in that range in the specification. Therefore, the recitation of a specific numerical range covers any numerical value in the numerical range and a smaller numerical range defined by any numerical values in the numerical range, as is the case with any numerical value and a smaller numerical range thereof in the specification.

The term "about", "approximately", "essentially", or "substantially" as used herein is inclusive of the stated value and means within an acceptable range of deviation for the particular value as determined by persons of ordinary skill in the art, considering the measurement in question and the error associated with measurement of the particular quantity (i.e., the limitations of the measurement system). For example, "about" may indicate that a value is within one or more standard deviations, or is within, for example, ±30%, ±20%, ±15%, ±10%, ±5%. Moreover, a more acceptable range of deviation or a standard deviation may be chosen for the term "about", "approximately", "essentially", or "substantially" used herein based on measurement properties, cutting properties or other properties, instead of applying one standard deviation across all the properties.

In the accompanying drawings, thicknesses of layers, films, panels, regions and so on are exaggerated for clarity. Throughout the specification, the same reference numerals in the accompanying drawings denote the same elements. It should be understood that when an element such as a layer, film, region or substrate is referred to as being "on" or "connected to" another element, it can be directly on or connected to the other element, or intervening elements may also be exist. In contrast, when an element is referred to as being "directly on" or "directly connected to" another element, no intervening elements exists. As used herein, the term "connected" may refer to physically connected and/or electrically connected. Therefore, intervening elements may exist in an electrical connection (coupling) between two elements.

Unless otherwise defined, all terms (including technical and scientific terms) used herein have the same meaning as commonly understood by persons with ordinary skill in the art. It will be further understood that terms, such as those defined in commonly used dictionaries, should be interpreted as having a meaning that is consistent with their meaning in the context of the relevant art and the invention and will not be interpreted in an idealized or overly formal sense unless expressly so defined herein.

Figure 1B:
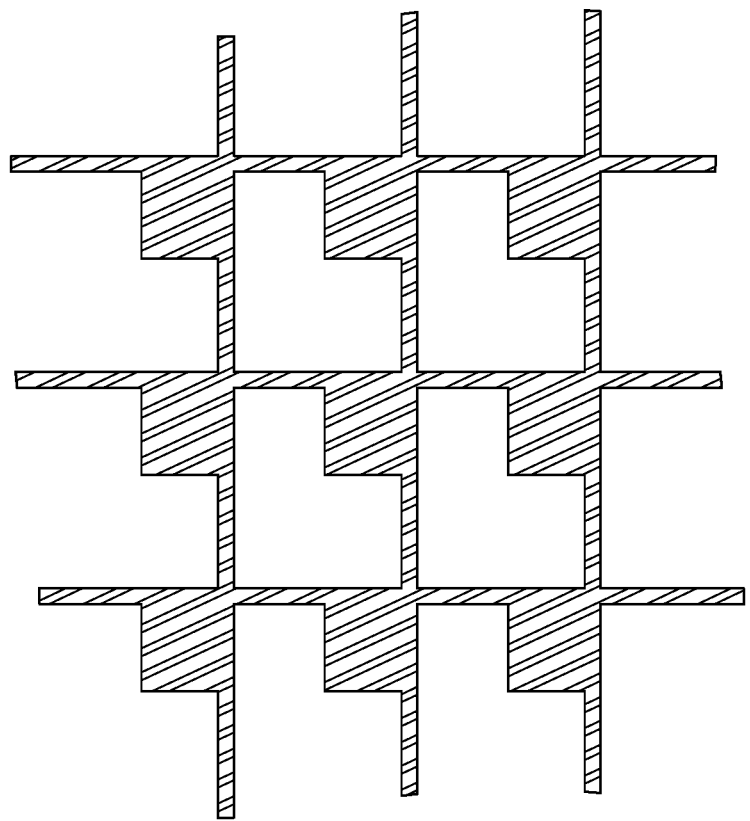
FIG. 1B is a top view of a top electrode according to an embodiment of the invention.

FIG. 1A is a cross-sectional view of a display device according to an embodiment of the invention. FIG. 1B is a top view of a top electrode according to an embodiment of the invention.

With reference to FIG. 1A, a display device 1 includes a first substrate 100, a first active element layer AL1, a first light-emitting element L1, a second light-emitting element L2, a third light-emitting element L3, a first pixel defining layer 150, a fourth light-emitting element L4, a fifth light-emitting element L5 and a sixth light-emitting element L6. In the present embodiment, the display device 1 further includes a second substrate 200 and a second active element layer AL2. For instance, the display device 1 includes a first light-emitting substrate 10 and a second light-emitting substrate 20. The first light-emitting substrate 10 includes the first substrate 100, the first active element layer AL1, the first pixel defining layer 150, the first light-emitting element L1, the second light-emitting element L2 and the third light-emitting element L3, and the second light-emitting substrate 20 includes the second substrate 200, the second active element layer AL2, a second pixel defining layer 250, the fourth light-emitting element L4, the fifth light-emitting element L5 and the sixth light-emitting element L6.

A material of the first substrate 100 is, for example, a glass, a quartz, an organic polymer or an opaque/reflective material (e.g., a conductive material, a metal, a wafer, a ceramic, or other applicable materials) or other applicable materials. If the conductive material or the metal is used, the first substrate 100 is covered with an insulation layer (not illustrated) to avoid short circuit problems.

The first active element layer AL1 is disposed on the first substrate 100. The first active element layer AL1 includes a first buffer layer 110, a first insulation layer 120, a second insulation layer 130, a third insulation layer 140, a first gate insulation layer GI1 and a plurality of first active elements TFT1.

The first active elements TFT1 are disposed on the first substrate 100. The first buffer layer 110 is disposed between the active elements TFT1 and the first substrate 100. The first active element TFT1 includes a channel layer CH1, a gate G1, a source S1 and a drain D1. The gate G1 is electrically connected with a scan line (not illustrated). The gate G1 overlaps with the channel layer CH1, and the first gate insulation layer GI1 is interposed between the gate G1 and the channel layer CH1. The first insulation layer 120 covers the gate G1. The source S1 and the drain D1 are disposed on the first insulation layer 120, and electrically connected with the channel layer CH1 via openings H1 and H2 respectively. The openings H1 and H2 at least penetrate the first insulation layer 120. In the present embodiment, the openings H1 and H2 penetrate the first gate insulation layer GI1 and the first insulation layer 120. The source S1 is electrically connected with a data line (not illustrated). In certain embodiments, a material of the gate G1, the source S1 and the drain D1 includes (but not limited to): a metal material or other conductive materials. Here, the metal material includes, for example, Cr, Au, Ag, Cu, Sn, Pb, Hf, W, Mo, Nd, Ti, Ta, Al, Zn or an alloy of the above materials.

In the present embodiment, the first active elements TFT1 are exemplified by a thin film transistor of top gate type, but the invention is not limited thereto. In other embodiments, the first active elements TFT1 may also be a thin film transistor of bottom gate type or other types.

The second insulation layer 130 covers the first insulation layer 120. Further, the second insulation layer 130 covers the first active elements TFT1. The third insulation layer 140 covers the second insulation layer 130. The first light-emitting element L1, the second light-emitting element L2 and the third light-emitting element L3 are disposed on the first active element layer AL1. The first light-emitting element L1, the second light-emitting element L2 and the third light-emitting element L3 are electrically connected with the first active element layer AL1. The number of the insulation layers between the first light-emitting element L1 and the first active elements TFT1, between the second light-emitting element L2 and the first active elements TFT1 and between the third light-emitting element L3 and the first active elements TFT1 may be adjusted according to actual requirements. In the present embodiment, the second insulation layer 130 and the third insulation layer 140 are interposed between the first light-emitting element L1 and the first active elements TFT1, between the second light-emitting element L2 and the first active elements TFT1 and between the third light-emitting element L3 and the first active elements TFT1. The first light-emitting element L1, the second light-emitting element L2 and the third light-emitting element L3 are electrically connected with the drain D1 of the corresponding first active element TFT1 via an opening C1, an opening C2 and an opening C3 respectively. The opening C1, the opening C2 and the opening C3 penetrate the second insulation layer 130 and the third insulation layer 140.

The first light-emitting element L1 includes a first electrode B1, a first light-emitting layer E1 and a second electrode T1 stacked in sequence. That is to say, a portion where the first electrode B1, the first light-emitting layer E1 and the second electrode T1 overlap together constitutes the first light-emitting element L1. The second light-emitting element L2 includes a first electrode B2, a second light-emitting layer E2 and a second electrode T2 stacked in sequence. That is to say, a portion where the first electrode B2, the second light-emitting layer E2 and the second electrode T2 overlap together constitutes the second light-emitting element L2. The third light-emitting element L3 includes a first electrode B3, a third light-emitting layer E3 and a second electrode T3 stacked in sequence. That is to say, a portion where the first electrode B3, the third light-emitting layer E3 and the second electrode T3 overlap together constitutes the third light-emitting element L3. Colors of the first light-emitting layer E1, the second light-emitting layer E2 and the third light-emitting layer E3 are different from each other. For instance, the first light-emitting element L1, the second light-emitting element L2 and the third light-emitting element L3 include, for example, three of a red light-emitting element, a blue light-emitting element, a green light-emitting element, a white light-emitting element and light-emitting elements of other colors. In an embodiment, the first light-emitting element L1 is the red light-emitting element, the second light-emitting element L2 is the green light-emitting element, and the third light-emitting element L3 is the blue light-emitting element. In the present embodiment, the first light-emitting element L1, the second light-emitting element L2 and the third light-emitting element L3 are organic light-emitting diodes, but the invention is not limited thereto. In other embodiments, the first light-emitting element L1, the second light-emitting element L2 and the third light-emitting element L3 are inorganic light-emitting diodes.

The first electrode B1, the first electrode B2 and the first electrode B3 are disposed on the first active element layer AL1. The first pixel defining layer 150 is disposed on the first active element layer AL1 and has a first opening O1, a second opening O2 and a third opening O3. The first opening O1, the second opening O2 and the third opening O3 are disposed corresponding to the first electrode B1, the first electrode B2, and the first electrode B3 respectively. In certain embodiments, a material of the first pixel defining layer 150 includes a photoresist material.

The first light-emitting layer E1, the second light-emitting layer E2 and the third light-emitting layer E3 are disposed in the first opening O1, the second opening O2 and the third opening O3 respectively.

The second electrode T1, the second electrode T2 and the second electrode T3 are disposed on the first light-emitting layer E1, the second light-emitting layer E2 and the third light-emitting layer E3 respectively. Referring to FIG. 1A and FIG. 1B together, the second electrode T1, the second electrode T2 and the second electrode T3 may be connected with each other to form a top electrode T in mesh shape. Here, a wider portion of the top electrode T may be disposed corresponding to the first light-emitting layer E1, the second light-emitting layer E2 and the third light-emitting layer E3. That is to say, the wider portion of the top electrode T may serve as the second electrode T1, the second electrode T2 and the second electrode T3. In other embodiments, the second electrode T1, the second electrode T2 and the second electrode T3 may also be connected with each other to form a broad area structure disposed on the first light-emitting layer E1, the second light-emitting layer E2, the third light-emitting layer E3 and the first pixel defining layer 150.

In certain embodiments, the first electrode B1, the first electrode B2 and the first electrode B3 may have a higher reflective index, and the second electrode T1, the second electrode T2 and the second electrode T3 may have a higher transmittance. In this way, light rays of the first light-emitting element L1, the second light-emitting element L2 and the third light-emitting element L3 can have a higher utilization. The first light-emitting element L1, the second light-emitting element L2 and the third light-emitting element L3 are, for example, top-emission light-emitting elements. In other words, the light rays emitted by the first light-emitting element L1, the second light-emitting element L2 and the third light-emitting element L3 substantially leaves the display device 1 from the second substrate 200. In certain embodiments, a material of the first electrode B1, the first electrode B2 and the first electrode B3 includes (but not limited to): a metal material or other conductive materials. Here, the metal material includes, for example, Cr, Au, Ag, Cu, Sn, Pb, Hf, W, Mo, Nd, Ti, Ta, Al, Zn or an alloy of the above materials. In certain embodiments, a material of the second electrode T1, the second electrode T2 and the second electrode T3 may be a transparent material, including (but not limited to): a metal-oxide material or a thin metal material. Here, the metal-oxide material includes, for example, an indium tin oxide, an indium zinc oxide, an aluminum tin oxide, an aluminum zinc oxide or an indium gallium zinc oxide, and the thin metal material includes, for example, Al, Ag or a Mg—Ag alloy.

The second substrate 200 is disposed opposite to the first substrate 100. The first active element layer AL1, the first pixel defining layer 150, the first light-emitting element L1, the second light-emitting element L2, the third light-emitting element L3, the second active element layer AL2, the second pixel defining layer 250, the fourth light-emitting element L4, the fifth light-emitting element L5 and the sixth light-emitting element L6 are disposed between the first substrate 100 and the second substrate 200. The substrate 200 is, for example, a transparent substrate. A material of the second substrate 200 may be, for example, a glass, a quartz, an organic polymer, or other suitable materials.

The second active element layer AL2 is disposed on the second substrate 200. The second active element layer AL2 includes a second buffer layer 210, a fourth insulation layer 220, a fifth insulation layer 230, a sixth insulation layer 240, a second gate insulation layer GI2 and a plurality of second active elements TFT2.

The second active elements TFT2 are disposed on the second substrate 200. The second buffer layer 210 is disposed between the second active elements TFT2 and the second substrate 200. The second active element TFT2 includes a channel layer CH2, a gate G2, a source S2 and a drain D2. The gate G2 is electrically connected with the scan line (not illustrated). The gate G2 overlaps with the channel layer CH2, and the second gate insulation layer GI2 is interposed between the gate G2 and the channel layer CH2. The fourth insulation layer 220 covers the gate G2. The source S2 and the drain D2 are disposed on the fourth insulation layer 220, and electrically connected with the channel layer CH2 via openings H3 and H4 respectively. The openings H3 and H4 at least penetrate the fourth insulation layer 220. In the present embodiment, the openings H3 and H4 penetrate the second gate insulation layer GI2 and the fourth insulation layer 220. The source S2 is electrically connected with the data line (not illustrated). In certain embodiments, in order to improve transmittance of the second light-emitting substrate 20, a material of the gate G2, the source S2 and the drain D2 may be a transparent material, including (but not limited thereto): a metal-oxide material or a thin metal material. Here, the metal-oxide material includes, for example, an indium tin oxide, an indium zinc oxide, an aluminum tin oxide, an aluminum zinc oxide or an indium gallium zinc oxide, and the thin metal material includes, for example, Al, Ag or a Mg—Ag alloy.

In the present embodiment, the second active elements TFT2 are exemplified by a thin film transistor of top gate type, but the invention is not limited thereto. In other embodiments, the second active elements TFT2 may also be a thin film transistor of bottom gate type or other types.

The fifth insulation layer 230 covers the fourth insulation layer 220. The sixth insulation layer 240 covers the fifth insulation layer 230. The fourth light-emitting element L4, the fifth light-emitting element L5 and the sixth light-emitting element L6 are disposed on the second active element layer AL2. The fourth light-emitting element L4, the fifth light-emitting element L5 and the sixth light-emitting element L6 are electrically connected with the second active element layer AL2. The number of the insulation layers between the fourth light-emitting element L4 and the second active elements TFT2, between the fifth light-emitting element L5 and the second active elements TFT2 and between the sixth light-emitting element L6 and the second active elements TFT2 may be adjusted according to actual requirements. In the present embodiment, the fifth insulation layer 230 and the sixth insulation layer 240 are interposed between the fourth light-emitting element L4 and the second active elements TFT2, between the fifth light-emitting element L5 and the second active elements TFT2 and between the sixth light-emitting element L6 and the second active elements TFT2. The fourth light-emitting element L4, the fifth light-emitting element L5 and the sixth light-emitting element L6 are electrically connected with the drain D2 of the corresponding second active element TFT2 via an opening C4, an opening C5 and an opening C6 respectively. The opening C4, the opening C5 and the opening C6 penetrate the fourth insulation layer 230 and the fifth insulation layer 240.

The fourth light-emitting element L4, the fifth light-emitting element L5 and the sixth light-emitting element L6 are disposed on the first pixel defining layer 150. The fourth light-emitting element L4 includes a first electrode B4, a fourth light-emitting layer E4 and a second electrode T4 stacked in sequence. In other words, a portion where the first electrode B4, the fourth light-emitting layer E4 and the second electrode T4 overlap together constitutes the fourth light-emitting element L4. The fifth light-emitting element L5 includes a first electrode B5, a fifth light-emitting layer E5 and a second electrode T5 stacked in sequence. In other words, a portion where the first electrode B5, the fifth light-emitting layer E5 and the second electrode T5 overlap together constitutes the fifth light-emitting element L5. The sixth light-emitting element L6 includes a first electrode B6, a sixth light-emitting layer E6 and a second electrode T6 stacked in sequence. In other words, a portion where the first electrode B6, the sixth light-emitting layer E6 and the second electrode T6 overlap together constitutes the sixth light-emitting element L6. Colors of the fourth light-emitting layer E4, the fifth light-emitting layer E5 and the sixth light-emitting layer E6 are different from each other. For instance, the fourth light-emitting element L4, the fifth light-emitting element L5 and the sixth light-emitting element L6 include, for example, three of the red light-emitting element, the blue light-emitting element, the green light-emitting element, the white light-emitting element and light-emitting elements of other colors. In an embodiment, the fourth light-emitting element L4 is the red light-emitting element, the fifth light-emitting element L5 is the green light-emitting element, and the sixth light-emitting element L6 is the blue light-emitting element. In the present embodiment, the fourth light-emitting element L4, the fifth light-emitting element L5 and the sixth light-emitting element L6 are organic light-emitting diodes, but the invention is not limited thereto. In other embodiments, the fourth light-emitting element L4, the fifth light-emitting element L5 and the sixth light-emitting element L6 are inorganic light-emitting diodes.

In the present embodiment, the colors of the first light-emitting layer E1 and the fourth light-emitting layer E4 are identical, the colors of the second light-emitting layer E2 and the fifth light-emitting layer E5 are identical, and the colors of the third light-emitting layer E3 and the sixth light-emitting layer E6 are identical. However, the invention is not limited in this regard. In other embodiments, the colors of the second light-emitting layer E2, the fourth light-emitting layer E4 and the fifth light-emitting layer E5 are different from each other, and the colors of the third light-emitting layer E3, the fifth light-emitting layer E5 and the sixth light-emitting layer E6 are different from each other.

The first electrode B4, the first electrode B5 and the first electrode B6 are disposed on the second active element layer AL2. The second pixel defining layer 250 is disposed on the second active element layer AL2 and has a fourth opening O4, a fifth opening O5 and a sixth opening O6. The fourth opening O4, the fifth opening O5 and the sixth opening O6 are disposed corresponding to the first electrode B4, the first electrode B5 and the first electrode B6 respectively. In certain embodiments, a material of the second pixel defining layer 250 includes a photoresist material.

The fourth light-emitting layer E4, the fifth light-emitting layer E5 and the sixth light-emitting layer E6 are disposed in the fourth opening O4, the fifth opening O5 and the sixth opening O6 respectively.

The second electrode T4, the second electrode T5 and the second electrode T6 are disposed on the fourth light-emitting layer E4, the fifth light-emitting layer E5 and the sixth light-emitting layer E6 respectively. The second electrode T4, the second electrode T5 and the second electrode T6 may be connected with each other to form a top electrode in mesh shape (which is similar to the top electrode T of FIG. 1B). In this way, the second electrode T4, the second electrode T5 and the second electrode T6 may be electrically connected with each other and the light rays emitted by the first light-emitting element L1, the second light-emitting element L2 and the third light-emitting element L3 can penetrate the second light-emitting substrate 20 to improve transmittance of the second light-emitting substrate 20. However, the top electrode in mesh shape is not limited to what illustrated in FIG. 1B, and any structures capable of allowing the second electrode T4, the second electrode T5 and the second electrode T6 to be electrically connected with each other and allowing the light rays emitted by the first light-emitting element L1, the second light-emitting element L2 and the third light-emitting element L3 to penetrate the second light-emitting substrate 20 all fall within the scope of the invention.

In the present embodiment, the first electrode B1, the first electrode B2, the first electrode B3, the first electrode B4, the first electrode B5 and the first electrode B6 serve as, for example, anodes, and the second electrode T1, the second electrode T2, the second electrode T3, the second electrode T4, the second electrode T5 and the second electrode T6 serve as, for example, cathodes. However, it should be noted that in other embodiments, based on design requirements, the first electrode B1, the first electrode B2, the first electrode B3, the first electrode B4, the first electrode B5 and the first electrode B6 may also serve as the cathodes, and the second electrode T1, the second electrode T2, the second electrode T3, the second electrode T4, the second electrode T5 and the second electrode T6 may serve as the anodes. In the present embodiment, the second electrode T1 and the second electrode T4 are disposed between the first light-emitting layer E1 and the fourth light-emitting layer E4; the second electrode T2 and the second electrode T5 are disposed between the second light-emitting layer E2 and the fifth light-emitting layer E5; and the second electrode T3 and the second electrode T6 are disposed between the third light-emitting layer E3 and the sixth light-emitting layer E6. In other words, in the present embodiment, electrodes with identical polarity in the first light-emitting element L1 and the fourth light-emitting element L4 are disposed between the first light-emitting layer E1 and the fourth light-emitting layer E4, electrodes with identical polarity in the second light-emitting element L2 and the fifth light-emitting element L5 are disposed between the second light-emitting layer E2 and the fifth light-emitting layer E5, and electrodes with identical polarity in the third light-emitting element L3 and the sixth light-emitting element L6 are disposed between the third light-emitting layer E3 and the sixth light-emitting layer E6.

In certain embodiments, the first electrode B4, the first electrode B5 and the first electrode B6 may have a higher transmittance, and the second electrode T4, the second electrode T5 and the second electrode T6 may have a higher reflective index. Accordingly, light rays of the first light-emitting element L4, the second light-emitting element L5 and the third light-emitting element L6 can have a higher utilization. In certain embodiments, a material of the second electrode T4, the second electrode T5 and the second electrode T6 includes (but not limited to): a metal material or other conductive materials. Here, the metal material includes, for example, Cr, Au, Ag, Cu, Sn, Pb, Hf, W, Mo, Nd, Ti, Ta, Al, Zn or an alloy of the above materials. In certain embodiments, a material of the first electrode B4, the first electrode B5 and the first electrode B6 may be a transparent material, including (but not limited to): a metal-oxide material such as an indium tin oxide, an indium zinc oxide, an aluminum tin oxide, an aluminum zinc oxide or an indium gallium zinc oxide.

The fourth light-emitting element L4, the fifth light-emitting element L5 and the sixth light-emitting element L6 are, for example, bottom-emission light-emitting elements. In other words, the light rays emitted by the fourth light-emitting element L4, the fifth light-emitting element L5 and the sixth light-emitting element L6 substantially leaves the display device 1 from the second substrate 200. In FIG. 1A, although it is illustrated that the first light-emitting element L1, the second light-emitting element L2 and the third light-emitting element L3 are overlapping with the first active elements TFT1 and the fourth light-emitting element L4, the fifth light-emitting element L5 and the sixth light-emitting element L6 are overlapping with the second active elements TFT2, but the invention is not limited thereto. In other embodiments, the first light-emitting element L1, the second light-emitting element L2 and the third light-emitting element L3 are not overlapping with the first active elements TFT1 and the fourth light-emitting element L4, the fifth light-emitting element L5 and the sixth light-emitting element L6 are not overlapping with the second active elements TFT2.

In the present embodiment, the second light-emitting substrate 20 includes a plurality of transparent regions TR, and the transparent regions TR are disposed between adjacent two of the fourth light-emitting element L4, the fifth light-emitting element L5 and the sixth light-emitting element L6. In the present embodiment, the transparent regions TR are provided between the fourth light-emitting element L4 and the fifth light-emitting element L5 and between the fifth light-emitting element L5 and the sixth light-emitting element L6. It should be noted that, the transparent region TR may also be provided between the fourth light-emitting element L4 and another light-emitting element (not illustrated), and the transparent region TR may also be provided between the sixth light-emitting element L6 and another light-emitting element (not illustrated) such that the transparent region TR is provided on at least two sides of the fourth light-emitting element L4, at least two sides of the fifth light-emitting element L5 and at least two sides of the sixth light-emitting element L6.

The second light-emitting element L2 is disposed between the fourth light-emitting element L4 and the fifth light-emitting element L5. The third light-emitting element L3 is disposed between the fifth light-emitting element L5 and the sixth light-emitting element L6. In other words, the first light-emitting element L1, the second light-emitting element L2 and the third light-emitting element L3 are overlapping with the transparent regions TR, and the fourth light-emitting element L4, the fifth light-emitting element L5 and the sixth light-emitting element L6 are alternately arranged with the transparent regions TR. Accordingly, the light rays emitted by the first light-emitting element L1, the second light-emitting element L2 and the third light-emitting element L3 may be effectively utilized. In certain embodiments, a size of each of the transparent regions TR in the second light light-emitting substrate 20 is greater than or equal to a size of the corresponding one of the first light-emitting element L1, the second light-emitting element L2 and the third light-emitting element L3.

In certain embodiments, portions of the first light-emitting substrate 10 corresponding to the fourth light-emitting element L4, the fifth light-emitting element L5 and the sixth light-emitting element L6 may be disposed with wires (not illustrated), other active elements (not illustrated) and/or other passive elements (not illustrated). Further, the wires are made of a material that can reflect the light ray (e.g., a metal material) such that the portions of the first light-emitting substrate 10 overlapping with the fourth light-emitting element L4, the fifth light-emitting element L5 and the sixth light-emitting element L6 have transmittance of only 3% to 8%. In certain embodiments, portions of the second light-emitting substrate 20 corresponding to the first light-emitting element L1, the second light-emitting element L2 and the third light-emitting element L3 (i.e., the transparent regions TR) may be disposed with wires (not illustrated), other active elements (not illustrated) and/or other passive elements (not illustrated). However, because the wires are made of a material with a higher transparency (e.g., a transparent conductive material), the portions of the second light-emitting substrate 20 overlapping with the first light-emitting element L1, the second light-emitting element L2 and the third light-emitting element L3 (i.e., the transparent region TR) have transmittance of 30% to 80%.

A gap GP is provided between the first light-emitting element L1 and the fourth light-emitting element L4, between the second light-emitting element L2 and the fifth light-emitting element L5 and between the third light-emitting element L3 and the sixth light-emitting element L6. In addition, a vertical distance V between the first light-emitting element L1 and the fourth light-emitting element L4 is greater than 0 micrometers and less than or equal to 5 micrometers. In the present embodiment, a portion of the second electrode T1 not overlapping with the first electrode B1 and the first light-emitting layer E1 is not regarded as the first light-emitting element L1, and a portion of the second electrode T4 not overlapping with the first electrode B4 and the fourth light-emitting layer E4 is not regarded as the fourth light-emitting element L4. In other words, the vertical distance V is a distance between a portion of the second electrode T2 overlapping with the first electrode B1 and the first light-emitting layer E1 and a potion of the second electrode T4 overlapping with the first electrode B4 and the fourth light-emitting layer E4. In certain embodiments, the vertical distance V between the first light-emitting element L1 and the fourth light-emitting element L4 is from 3 micrometers to 5 micrometers. In the present embodiment, the first light-emitting element L1, the second light-emitting element L2 and the third light-emitting element L3 are disposed on the same plane, the fourth light-emitting element L4, the fifth light-emitting element L5 and the sixth light-emitting element L6 are disposed on another plane, and the two planes are substantially parallel. Therefore, the vertical distance between the first light-emitting element L1 and the fourth light-emitting element L4, a vertical distance between the second light-emitting element L2 and the fifth light-emitting element L5 and a vertical distance between the third light-emitting element L3 and the sixth light-emitting element L6 are substantially equal. It is worth noting that, although not shown in the drawings, persons with ordinary skill in the art can understand that the first light-emitting substrate 10 and the second light-emitting substrate display device 20 are fixed in the display device 1 by a packaging process so the display device 1 can have the gap GP and a size of the vertical distance V can be controlled.

Based on the above, with the plane on which the first light-emitting element L1, the second light-emitting element L2 and the third light-emitting element L3 are disposed being different from the plane on which the fourth light-emitting element L4, the fifth light-emitting element L5 and the sixth light-emitting element L6 are disposed, the second light-emitting element L2 disposed between the fourth light-emitting element L4 and the fifth light-emitting element L5, the third light-emitting element L3 disposed between the fifth light-emitting element L5 and the sixth light-emitting element L6 and the vertical distance V between the first light-emitting element L1 and the fourth light-emitting element L4 greater than 0 micrometers and less than or equal to 5 micrometers, a resolution of the display device 1 can be adjusted without increasing a resolution of a fine metal mask used in an evaporation process (e.g., an evaporation process for forming the light-emitting layers) so the display device 1 can have a larger light-emitting area in the same unit area than the conventional display device. In this way, the display device 1 can solve the problem of noticeable graininess on the pictures. Also, the lifetime of the display device 1 can also be extended.

Figure 2C:
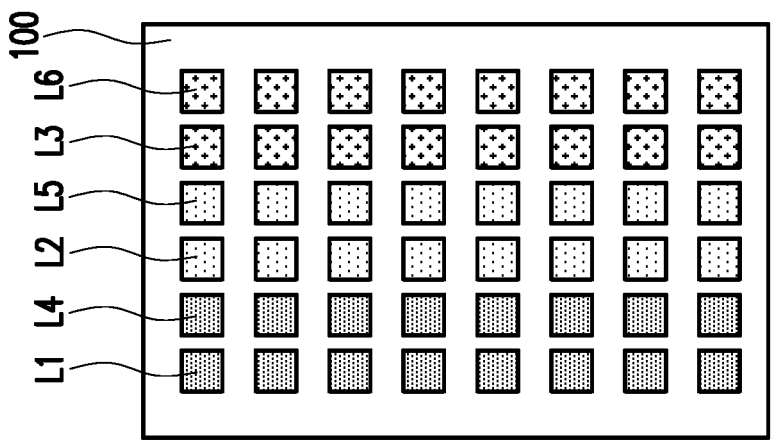
FIG. 2C is a top view of a display device according to an embodiment of the invention.
Figure 2B:
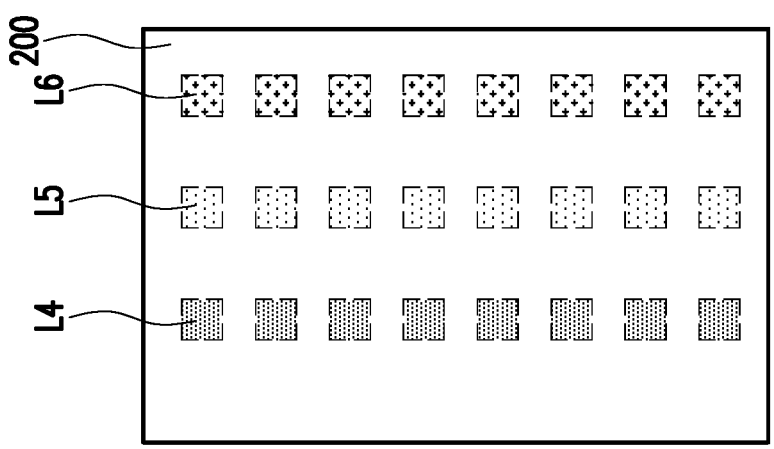
FIG. 2B is a top view showing an arrangement relationship of a second substrate, a fourth light-emitting element, a fifth light-emitting element and a sixth light-emitting element according to an embodiment of the invention.
Figure 2A:
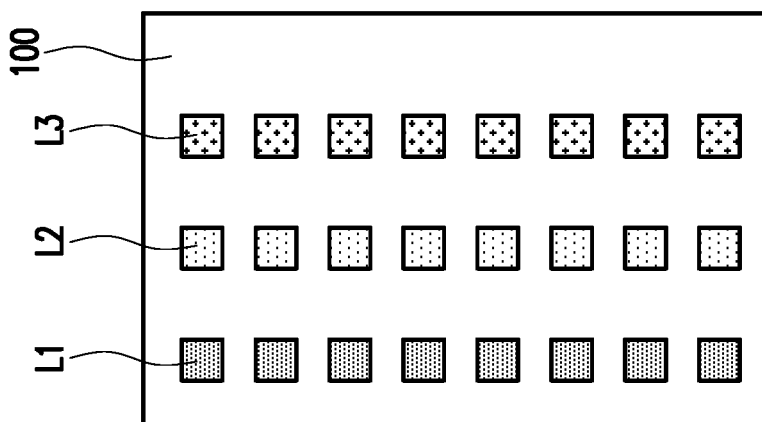
FIG. 2A is a top view showing an arrangement relationship of a first substrate, a first light-emitting element, a second light-emitting element and a third light-emitting element according to an embodiment of the invention.

FIG. 2A is a top view showing an arrangement relationship of a first substrate, a first light-emitting element, a second light-emitting element and a third light-emitting element according to an embodiment of the invention. FIG. 2B is a top view showing an arrangement relationship of a second substrate, a fourth light-emitting element, a fifth light-emitting element and a sixth light-emitting element according to an embodiment of the invention. FIG. 2C is a top view of a display device according to an embodiment of the invention. For descriptive convenience, FIG. 2C illustrates the first substrate 100, the first light-emitting element L1, the second light-emitting element L2, the third light-emitting element L3, the fourth light-emitting element L4, the fifth light-emitting element L5 and the sixth light-emitting element L6 and omits other components.

Detailed description will be provided below with reference to FIG. 2A to FIG. 2C. It should be noted that the reference numerals and a part of the contents in the previous embodiment are used in the following embodiments, in which identical or similar reference numerals indicate identical or similar elements, and repeated description of the same technical contents is omitted. The omitted part of the description can refer to the foregoing embodiment, which is not repeated in the following embodiments.

With reference to FIG. 2A to FIG. 2C, a plurality of the first light-emitting elements L1, a plurality of the second light-emitting elements L2 and a plurality of the third light-emitting elements L3 are disposed on the first substrate 100, and a plurality of the fourth light-emitting elements L4, a plurality of the fifth light-emitting elements L5 and a plurality of the sixth light-emitting elements L6 are disposed on the second substrate 200. In a display device 2, the second light-emitting element L2 is disposed between the fourth light-emitting element L4 and the fifth light-emitting element L5; the third light-emitting element L3 is disposed between the fifth light-emitting element L5 and the sixth light-emitting element L6; the fourth light-emitting element L4 is disposed between the first light-emitting element L1 and the second light-emitting element L2; and the fifth light-emitting element L5 is disposed between the second light-emitting element L2 and the third light-emitting element L3. In this way, the display device 2 can have a larger light-emitting area in the same unit area than the conventional display device, and can solve the problem of noticeable graininess on the pictures.

In the present embodiment, although the first light-emitting elements L1, the second light-emitting elements L2, the third light-emitting elements L3, the fourth light-emitting elements L4, the fifth light-emitting elements L5 and the sixth light-emitting elements L6 are separately arranged in columns, i.e., the light-emitting elements of the same color are arranged in one column, the invention is not limited thereto. In other embodiments, the light-emitting element in the same column may also include light-emitting elements with two or more different colors.

Figure 3:
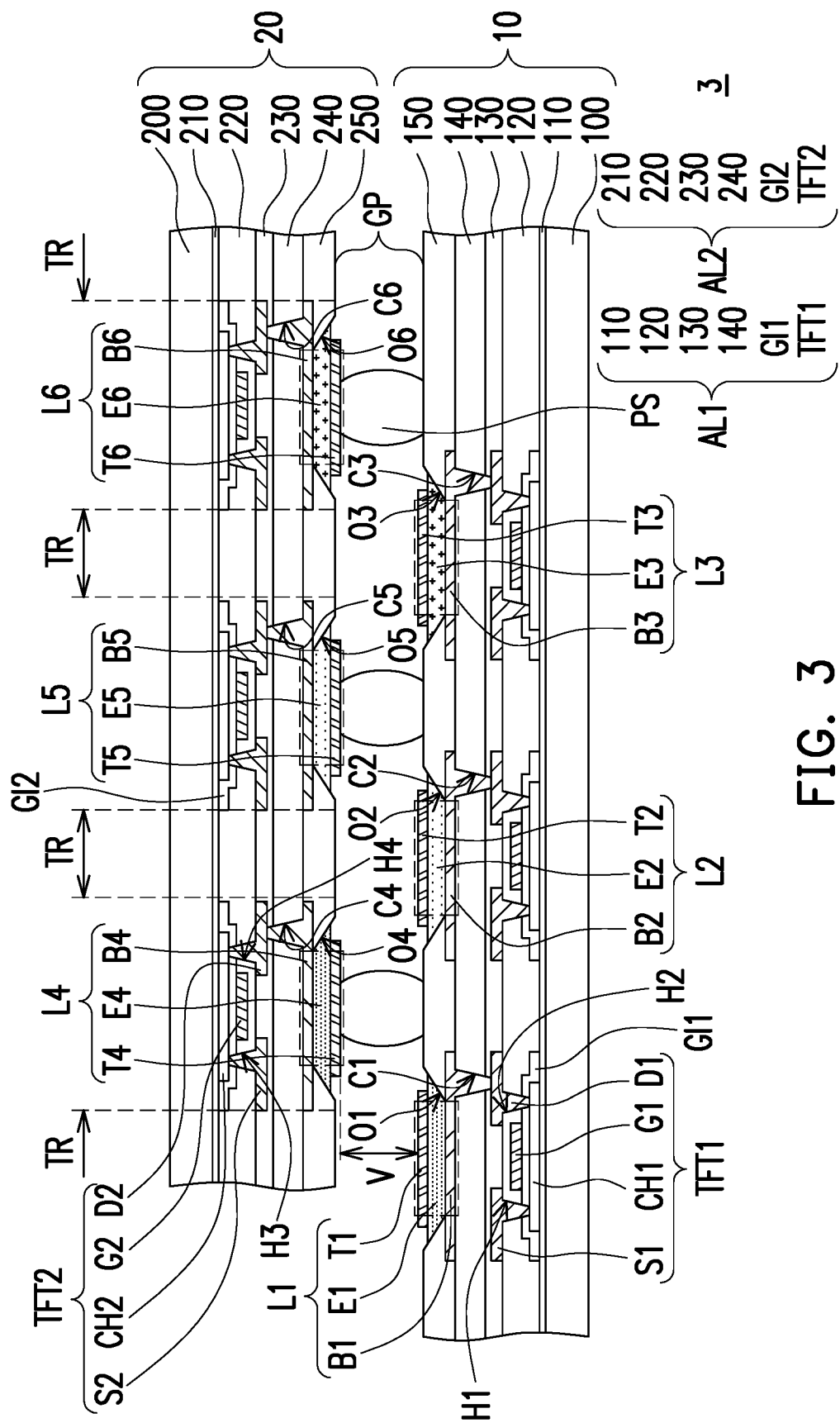
FIG. 3 is a cross-sectional view of a display device according to an embodiment of the invention.

FIG. 3 is a cross-sectional view of a display device according to an embodiment of the invention.

Detailed description will be provided below with reference to FIG. 3. It should be noted that the reference numerals and a part of the contents in the previous embodiment are used in the following embodiments, in which identical or similar reference numerals indicate identical or similar elements, and repeated description of the same technical contents is omitted. The omitted part of the description can refer to the foregoing embodiment, which is not repeated in the following embodiments.

A major difference between a display device 3 of FIG. 3 and the display device 1 of FIG. 1A is that, the display device 3 further includes a plurality of spacers PS disposed between the first substrate 100 and the second substrate 200. For instance, the display device 3 includes the first light-emitting substrate 10, the second light-emitting substrate 20 and the spacers PS.

In the present embodiment, the spacers PS space apart from the second electrode T1, the second electrode T2 and the second electrode T3, but the invention is not limited thereto. In other embodiments, when the second electrode T1, the second electrode T2 and the second electrode T3 are connected with each other to form the broad area structure disposed on the first light-emitting layer E1, the second light-emitting layer E2 the third light-emitting layer E3 and the first pixel defining layer 150, the second electrode T1, the second electrode T2 and the second electrode T3 cover the spacers PS, and the second electrode T1, the second electrode T2 and the second electrode T3 are electrically connected with the second electrode T4, the second electrode T5 and the second electrode T6.

In the present embodiment, the spacers PS are disposed between the fourth light-emitting element L4 and the first pixel defining layer 150, between the fifth light-emitting element L5 and the first pixel defining layer 150 and between the sixth light-emitting element L6 and the first pixel defining layer 150. Because the fourth light-emitting element L4, the fifth light-emitting element L5 and the sixth light-emitting element L6 are the bottom-emission light-emitting elements, the spacers PS have only little effect to luminous efficiency of the fourth light-emitting element L4, the fifth light-emitting element L5 and the sixth light-emitting element L6. Further, in the present embodiment, the spacers PS are directly connected to the fourth light-emitting element L4, the fifth light-emitting element L5, the sixth light-emitting element L6 and the first pixel defining layer 150.

By providing the spacers PS, the vertical distance V between the first light-emitting element L1 and the fourth light-emitting element L4 can be preferably controlled. Here, the vertical distance V is a distance between a portion of the second electrode T2 overlapping with the first electrode B1 and the first light-emitting layer E1 and a potion of the second electrode T4 overlapping with the first electrode B4 and the fourth light-emitting layer E4.

Figure 4:
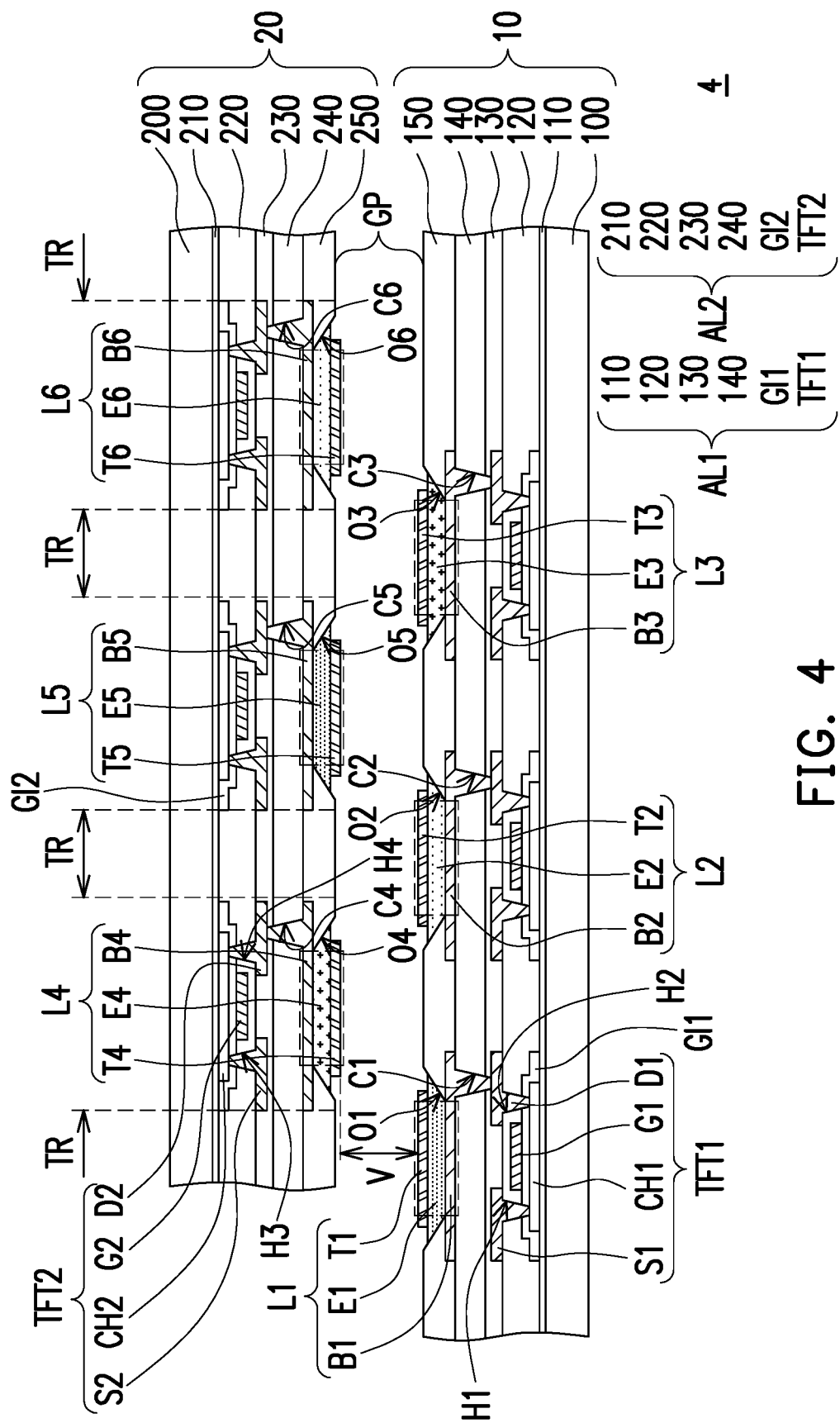
FIG. 4 is a cross-sectional view of a display device according to an embodiment of the invention.

FIG. 4 is a cross-sectional view of a display device according to an embodiment of the invention.

Detailed description will be provided below with reference to FIG. 4. It should be noted that the reference numerals and a part of the contents in the previous embodiment are used in the following embodiments, in which identical or similar reference numerals indicate identical or similar elements, and repeated description of the same technical contents is omitted. The omitted part of the description can refer to the foregoing embodiment, which is not repeated in the following embodiments.

A major difference between a display device 4 of FIG. 4 and the display device 1 of FIG. 1A is that, in the display device 4, the colors of the second light-emitting layer E2, the fourth light-emitting layer E4 and the fifth light-emitting layer E5 are different from each other, and the colors of the third light-emitting layer E3, the fifth light-emitting layer E5 and the sixth light-emitting layer E6 are different from each other. In other words, in the display device 4, the second light-emitting element L2, the fourth light-emitting element L4 and the fifth light-emitting element L5 include, for example, three of the red light-emitting element, the blue light-emitting element, the green light-emitting element, the white light-emitting element and light-emitting elements of other colors, and the third light-emitting element L3, the fifth light-emitting element L5 and the sixth light-emitting element L6 include, for example, three of the red light-emitting element, the blue light-emitting element, the green light-emitting element, the white light-emitting element and light-emitting elements of other colors. In an embodiment, the first light-emitting element L1 is the red light-emitting element; the second light-emitting element L2 is the green light-emitting element; the third light-emitting element L3 is the blue light-emitting element; the fourth light-emitting element L4 is the blue light-emitting element; the fifth light-emitting element L5 is the red light-emitting element; and the sixth light-emitting element L6 is the green light-emitting element.

Based on the above, with the plane on which the first light-emitting element L1, the second light-emitting element L2 and the third light-emitting element L3 are disposed being different from the plane on which the fourth light-emitting element L4, the fifth light-emitting element L5 and the sixth light-emitting element L6 are disposed, the second light-emitting element L2 disposed between the fourth light-emitting element L4 and the fifth light-emitting element L5, the third light-emitting element L3 disposed between the fifth light-emitting element L5 and the sixth light-emitting element L6 and the vertical distance V between the first light-emitting element L1 and the fourth light-emitting element L4 greater than 0 micrometers and less than or equal to 5 micrometers, a resolution of the display device 4 can be simply adjusted without increasing a resolution of a fine metal mask used in an evaporation process (e.g., an evaporation process for forming the light-emitting layer). As described above, in an embodiment, the first light-emitting element L1 (the red light-emitting element), the second light-emitting element L2 (the green light-emitting element) and the fourth light-emitting element L4 (the blue light-emitting element) may be regarded as being correspondingly disposed in one pixel, and the third light-emitting element L3 (the blue light-emitting element), the fifth light-emitting element L5 (the red light-emitting element) and the sixth light-emitting element L6 (the green light-emitting element) may be regarded as being correspondingly disposed in another pixel. As such, because the display device 4 can have a smaller pixel size than the conventional display device with the light-emitting elements disposed on the same plane, the display device 4 can have a higher resolution.

Figure 5C:
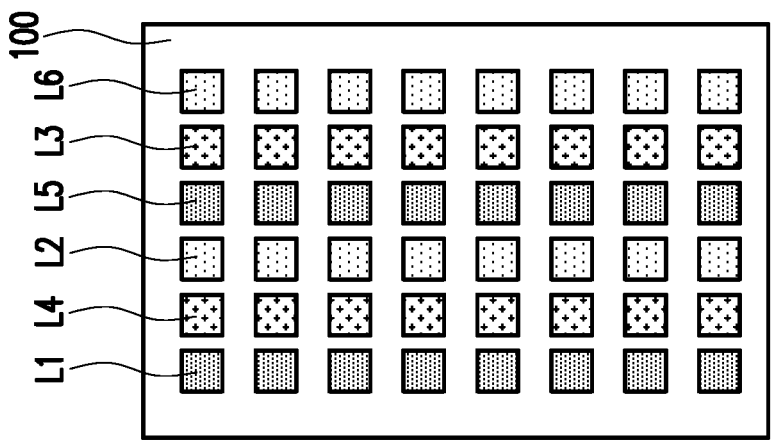
FIG. 5C is a top view of a display device according to an embodiment of the invention.
Figure 5B:
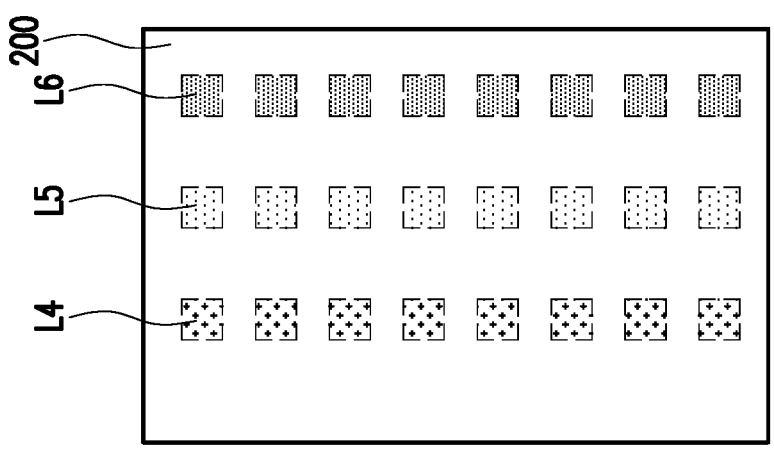
FIG. 5B is a top view showing an arrangement relationship of a second substrate, a fourth light-emitting element, a fifth light-emitting element and a sixth light-emitting element according to an embodiment of the invention.
Figure 5A:
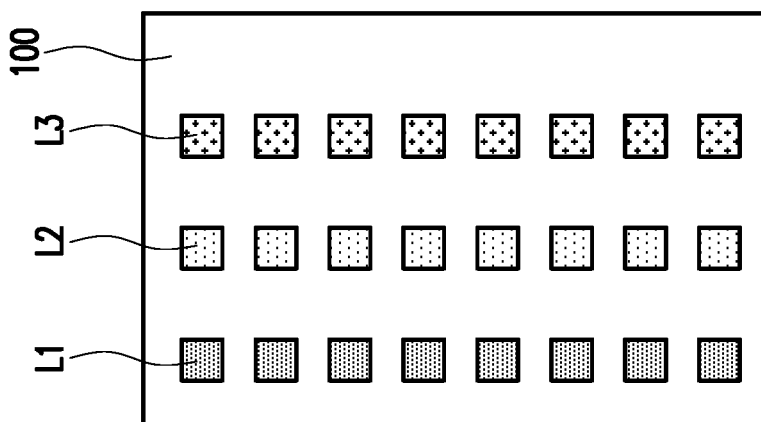
FIG. 5A is a top view showing an arrangement relationship of a first substrate, a first light-emitting element, a second light-emitting element and a third light-emitting element according to an embodiment of the invention.

FIG. 5A is a top view showing an arrangement relationship of a first substrate, a first light-emitting element, a second light-emitting element and a third light-emitting element according to an embodiment of the invention. FIG. 5B is a top view showing an arrangement relationship of a second substrate, a fourth light-emitting element, a fifth light-emitting element and a sixth light-emitting element according to an embodiment of the invention. FIG. 5C is a top view of a display device according to an embodiment of the invention. For descriptive convenience, FIG. 5C illustrates the first substrate, the first light-emitting element, the second light-emitting element, the third light-emitting element, the fourth light-emitting element, the fifth light-emitting element and the sixth light-emitting element and omits other components.

Detailed description will be provided below with reference to FIG. 5A to FIG. 5C. It should be noted that the reference numerals and a part of the contents in the previous embodiment are used in the following embodiments, in which identical or similar reference numerals indicate identical or similar elements, and repeated description of the same technical contents is omitted. The omitted part of the description can refer to the foregoing embodiment, which is not repeated in the following embodiments.

With reference to FIG. 5A to FIG. 5C, a plurality of the first light-emitting elements L1, a plurality of the second light-emitting elements L2 and a plurality of the third light-emitting elements L3 are disposed on the first substrate 100, and a plurality of the fourth light-emitting elements L4, a plurality of the fifth light-emitting elements L5 and a plurality of the sixth light-emitting elements L6 are disposed on the second substrate 200. In a display device 5, the second light-emitting element L2 is disposed between the fourth light-emitting element L4 and the fifth light-emitting element L5; the third light-emitting element L3 is disposed between the fifth light-emitting element L5 and the sixth light-emitting element L6; the fourth light-emitting element L4 is disposed between the first light-emitting element L1 and the second light-emitting element L2; and the fifth light-emitting element L5 disposed between the second light-emitting element L2 and the third light-emitting element L3. Here, the second light-emitting element L2, the fourth light-emitting element L4 and the fifth light-emitting element L5 are light-emitting elements of different colors, and the third light-emitting element L3, the fifth light-emitting element L5 and the sixth light-emitting element L6 are light-emitting elements of different colors. In this way, the display device 5 can have a higher resolution.

In the present embodiment, although the first light-emitting elements L1, the second light-emitting elements L2, the third light-emitting elements L3, the fourth light-emitting elements L4, the fifth light-emitting elements L5 and the sixth light-emitting elements L6 are separately arranged in columns, i.e., the light-emitting elements of the same color are arranged in one column, the invention is not limited thereto. In other embodiments, the light-emitting element in the same column may also include light-emitting elements with two or more different colors.

Figure 6:
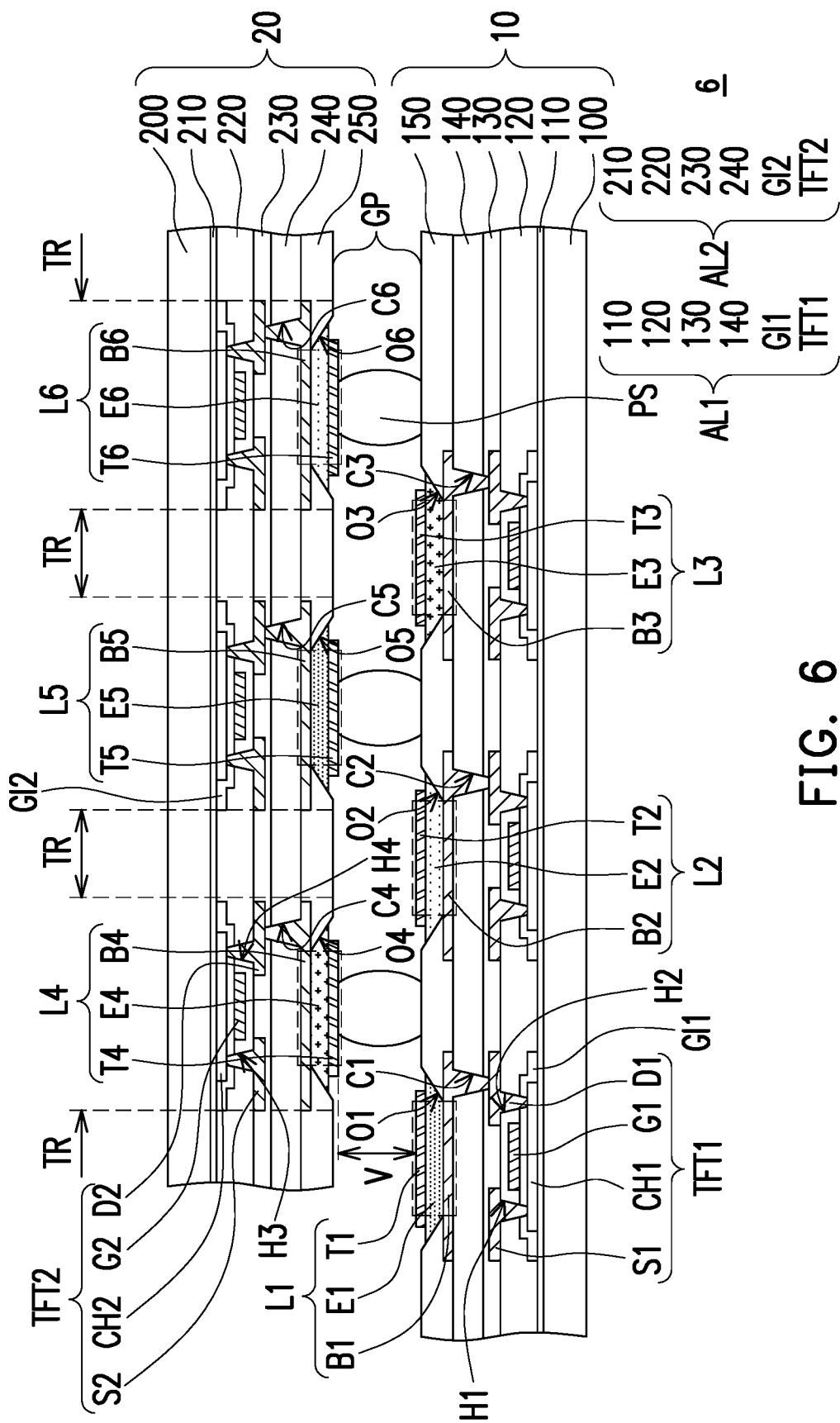
FIG. 6 is a cross-sectional view of a display device according to an embodiment of the invention.

FIG. 6 is a cross-sectional view of a display device according to an embodiment of the invention.

Detailed description will be provided below with reference to FIG. 6. It should be noted that the reference numerals and a part of the contents in the previous embodiment are used in the following embodiments, in which identical or similar reference numerals indicate identical or similar elements, and repeated description of the same technical contents is omitted. The omitted part of the description can refer to the foregoing embodiment, which is not repeated in the following embodiments.

A major difference between a display device 6 of FIG. 6 and the display device 4 of FIG. 4 is that, the display device 6 further includes a plurality of spacers PS disposed between the first substrate 100 and the second substrate 200. For instance, the display device 6 includes the first light-emitting substrate 10, the second light-emitting substrate 20 and the spacers PS.

In the present embodiment, the spacers PS space apart from the second electrode T1, the second electrode T2 and the second electrode T3, but the invention is not limited thereto. In other embodiments, when the second electrode T1, the second electrode T2 and the second electrode T3 are connected with each other to form the broad area structure disposed on the first light-emitting layer E1, the second light-emitting layer E2 the third light-emitting layer E3 and the first pixel defining layer 150, the second electrode T1, the second electrode T2 and the second electrode T3 cover the spacers PS, and the second electrode T1, the second electrode T2 and the second electrode T3 are electrically connected with the second electrode T4, the second electrode T5 and the second electrode T6.

In the present embodiment, the spacers PS are disposed between the fourth light-emitting element L4 and the first pixel defining layer 150, between the fifth light-emitting element L5 and the first pixel defining layer 150 and between the sixth light-emitting element L6 and the first pixel defining layer 150. Because the fourth light-emitting element L4, the fifth light-emitting element L5 and the sixth light-emitting element L6 are the bottom-emission light-emitting elements, the spacers PS have only little effect to luminous efficiency of the fourth light-emitting element L4, the fifth light-emitting element L5 and the sixth light-emitting element L6. Further, in the present embodiment, the spacers PS are directly connected to the fourth light-emitting element L4, the fifth light-emitting element L5, the sixth light-emitting element L6 and the first pixel defining layer 150.

By providing the spacers PS, the vertical distance V between the first light-emitting element L1 and the fourth light-emitting element L4 can be preferably controlled. Here, the vertical distance V is a distance between a portion of the second electrode T2 overlapping with the first electrode B1 and the first light-emitting layer E1 and a potion of the second electrode T4 overlapping with the first electrode B4 and the fourth light-emitting layer E4.

Figure 7:
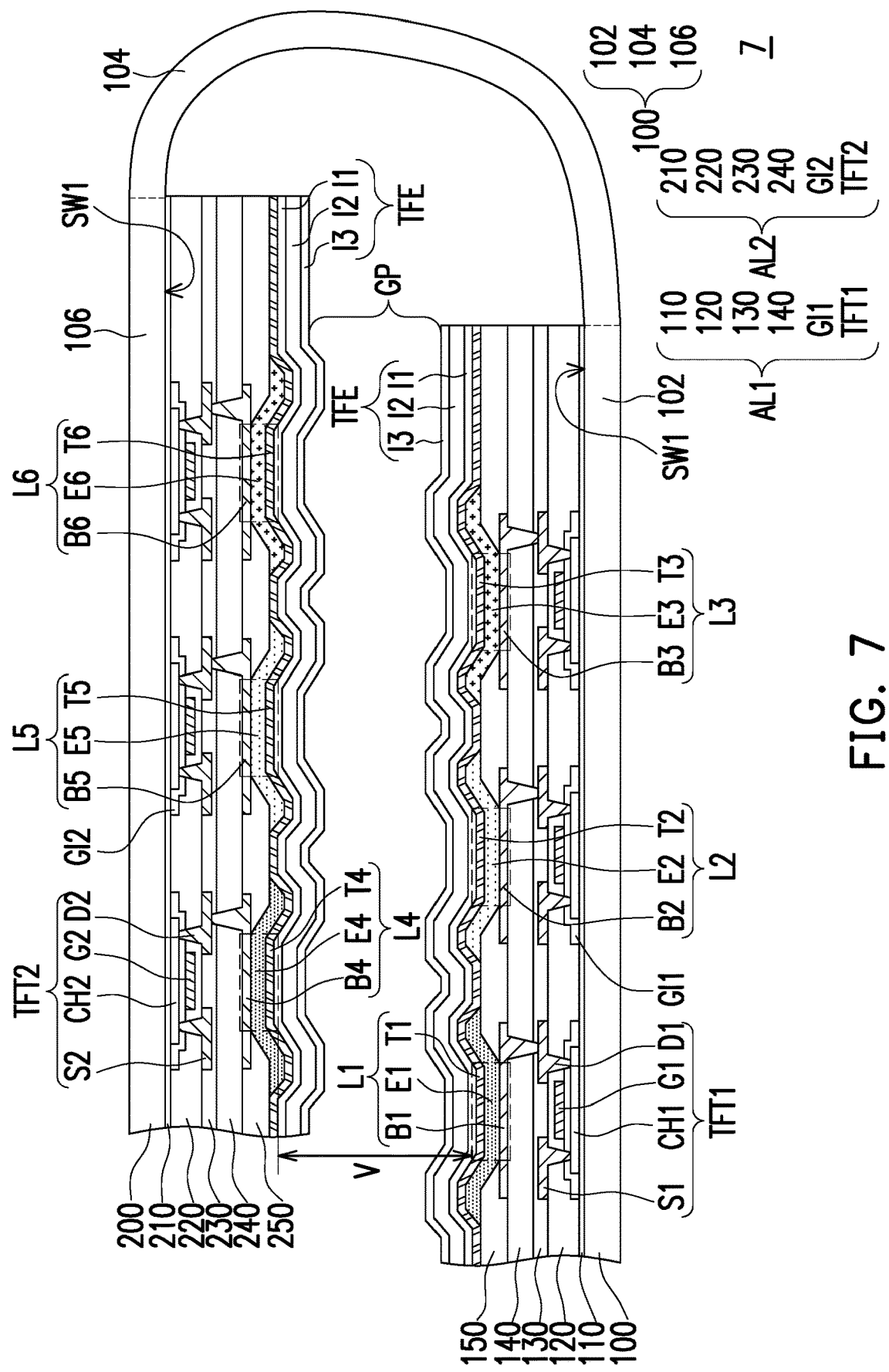
FIG. 7 is a cross-sectional view of a display device according to an embodiment of the invention.

FIG. 7 is a cross-sectional view of a display device according to an embodiment of the invention.

Detailed description will be provided below with reference to FIG. 7. It should be noted that the reference numerals and a part of the contents in the previous embodiment are used in the following embodiments, in which identical or similar reference numerals indicate identical or similar elements, and repeated description of the same technical contents is omitted. The omitted part of the description can refer to the foregoing embodiment, which is not repeated in the following embodiments.

A major difference between a display device 7 of FIG. 7 and the display device 1 of FIG. 1A is that, the first to sixth light-emitting elements L1 to L6 of the display device 7 are all disposed on the first substrate 100.

With reference to FIG. 7, the first substrate 100 includes a first region 102, a second region 106 and a bent portion 104 connecting the first region 102 and the second region 106. The first region 102 is disposed opposite to the second region 106. The bent portion 104 includes a flexible material. In the present embodiment, a material of the first substrate 100 is the flexible material, such as polyethylene terephthalate (PET), polyethylene naphthalate (PEN), polyester (PES), polymethylmethacrylate (PMMA), polycarbonate (PC), polyimide (PI) or a metal foil. However, the invention is not limited in this regard. In other embodiments, a material of the first region 102 and the second region 106 may include a rigid material, and the material of the bent portion 104 may include the flexible material.

In the present embodiment, the first light-emitting element L1, the second light-emitting element L2, the third light-emitting element L3, the fourth light-emitting element L4, the fifth light-emitting element L5 and the sixth light-emitting element L6 are all disposed on the first substrate 100. The first light-emitting element L1, the second light-emitting element L2 and the third light-emitting element L3 are disposed on the first region 102 of the first substrate 100, whereas the fourth light-emitting element L4, the fifth light-emitting element L5 and the sixth light-emitting element L6 are disposed on the second region 106 of the first substrate 100. On the other hand, the first light-emitting element L1, the second light-emitting element L2, the third light-emitting element L3, the fourth light-emitting element L4, the fifth light-emitting element L5 and the sixth light-emitting element L6 are disposed on an inner surface SW1 of the first substrate 100.

The first light-emitting element L1, the second light-emitting element L2 and the third light-emitting element L3 are, for example, the top-emission light-emitting elements, and the fourth light-emitting element L4, the fifth light-emitting element L5 and the sixth light-emitting element L6 are, for example, the bottom-emission light-emitting elements. In other words, the first light-emitting element L1, the second light-emitting element L2, the third light-emitting element L3, the fourth light-emitting element L4, the fifth light-emitting element L5 and the sixth light-emitting element L6 substantially emit light towards the second region 106 of the first substrate 100.

In the present embodiment, the first active element layer AL1 is, for example, formed together with the second active element layer AL2 in the same process. The first light-emitting element L1, the second light-emitting element L2 and the third light-emitting element L3 are, for example, formed together with the fourth light-emitting element L4, the fifth light-emitting element L5 and the sixth light-emitting element L6 in the same process. The first buffer layer 110 is, for example, formed together with the second buffer layer 210 in the same process. The first insulation layer 120 is, for example, formed together with the fourth insulation layer 220 in the same process. The second insulation layer 130 is, for example, formed together with the fifth insulation layer 230 in the same process. The third insulation layer 140 is, for example, formed together with the sixth insulation layer 240 in the same process. The first gate insulation layer GI1 is, for example, formed together with the second gate insulation layer GI2 in the same process.

After the first light-emitting element L1, the second light-emitting element L2, the third light-emitting element L3, the fourth light-emitting element L4, the fifth light-emitting element L5 and the sixth light-emitting element L6 are formed, a packaging layer TFE is formed on the first light-emitting element L1, the second light-emitting element L2, the third light-emitting element L3, the fourth light-emitting element L4, the fifth light-emitting element L5 and the sixth light-emitting element L6. The packaging layer TFE includes an inorganic layer I1, an inorganic layer I3 and an organic layer I2 disposed between the inorganic layer I1 and the inorganic layer I3. The number of the inorganic layers and the organic layers in the packaging layer TFE may be adjusted according to actual requirements.

In the present embodiment, although the bent portion 104 of the first substrate 100 is not disposed with other insulation layers, the invention is not limited thereto. In other embodiments, a control circuit and/or an IC element may be disposed on the bent portion 104 of the first substrate 100. In other embodiments, the first buffer layer 110, the second buffer layer 210, the first insulation layer 120, the second insulation layer 130, the third insulation layer 140, the fourth insulation layer 220, the fifth insulation layer 230, the sixth insulation layer 240, the first gate insulation layer GI1 and/or the second gate insulation layer GI2 may be disposed on the bent portion 104 of the first substrate 100.

Based on the above, the first to sixth light-emitting elements L1 to L6 in the display device 7 may be disposed on the same first substrate 100, so as to reduce production cost of the display device 7.

In summary, in the display device of at least one of the foregoing embodiments, the first, second and third light-emitting elements are electrically connected with the first active element layer; the plane on which the first, second and third light-emitting elements are disposed is different from the plane on which the fourth, fifth and sixth light-emitting elements are disposed; the second light-emitting element is disposed between the fourth and fifth light-emitting elements; the third light-emitting element is disposed between the fifth and the sixth light-emitting elements; and the vertical distance between the first light-emitting element and the fourth light-emitting element is greater than 0 micrometers and less than or equal to 5 micrometers. In this way, a resolution of the display device can be adjusted without increasing a resolution of a fine metal mask used in an evaporation process (e.g., an evaporation process for forming the light-emitting layer) so the display device can have a larger light-emitting area in the same unit area than the conventional display device. As a result, the display device of the invention can solve the problem of noticeable graininess on the pictures and extends its own lifetime. In certain embodiments, by adjusting the colors of the first to sixth light-emitting elements, the resolution of the display device may also be further improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A display device, comprising:
a first substrate;
a first active element layer, disposed on the first substrate;
a first light-emitting element, a second light-emitting element and a third light-emitting element, electrically connected with the first active element layer, wherein the first light-emitting element includes a first electrode, a first light-emitting layer and a second electrode stacked in sequence, wherein the second light-emitting element includes a first electrode, a second light-emitting layer and a second electrode stacked in sequence, and wherein the third light-emitting element includes a first electrode, a third light-emitting layer and a second electrode stacked in sequence, wherein the second electrodes of the first light-emitting element, the second light-emitting element and the third light-emitting element are electrically connected with each other;
a first pixel defining layer, disposed on the first active element layer and having a first opening, a second opening and a third opening, wherein the first light-emitting layer, the second light-emitting layer and the third light-emitting layer are disposed in the first opening, the second opening and the third opening respectively;
a fourth light-emitting element, a fifth light-emitting element and a sixth light-emitting element, disposed on the first pixel defining layer, wherein the fourth light-emitting element, the fifth light-emitting element and the sixth light-emitting element have a fourth light-emitting layer, a fifth light-emitting layer and a sixth light-emitting layer respectively, the second light-emitting element is disposed between the fourth light-emitting element and the fifth light-emitting element, and the third light-emitting element is disposed between the fifth light-emitting element and the sixth light-emitting element, wherein a vertical distance between the first light-emitting element and the fourth light-emitting element is greater than 0 micrometers and less than or equal to 5 micrometers; and
a plurality of spacers disposed on the first pixel defining layer, and disposed between the first substrate and a second substrate, wherein the spacers space apart from and do not contact the second electrodes of the first light-emitting element, the second light-emitting element, and the third light-emitting element, wherein the second electrode of the first light-emitting element and the second electrode of the fourth light-emitting element with identical polarity are disposed between the first light-emitting layer and the fourth light-emitting layer, the second electrode of the second light-emitting element and the second electrode of the fifth light-emitting element with identical polarity are disposed between the second light-emitting layer and the fifth light-emitting layer, and the second electrode of the third light-emitting element and the second electrode of the sixth light-emitting element with identical polarity are disposed between the third light-emitting layer and the sixth light-emitting layer.

2. The display device according to claim 1, wherein the second substrate is disposed opposite to the first substrate, wherein the first light-emitting element, the second light-emitting element, the third light-emitting element, the fourth light-emitting element, the fifth light-emitting element and the sixth light-emitting element are disposed between the first substrate and the second substrate.

3. The display device according to claim 2, further comprising:
a second active element layer, disposed on the second substrate, wherein the fourth light-emitting element, the fifth light-emitting element and the sixth light-emitting element are electrically connected with the second active element layer;
a second pixel defining layer, disposed on the second active element layer and having a fourth opening, a fifth opening and a sixth opening, wherein the fourth light-emitting layer, the fifth light-emitting layer and the sixth light-emitting layer are disposed in the fourth opening, the fifth opening and the sixth opening respectively.

4. The display device according to claim 1, wherein the spacers are disposed between the fourth light-emitting element and the first pixel defining layer, between the fifth light-emitting element and the first pixel defining layer and between the sixth light-emitting element and the first pixel defining layer.

5. The display device according to claim 1, wherein colors of the first light-emitting layer, the second light-emitting layer and the third light-emitting layer are different from each other, and colors of the fourth light-emitting layer, the fifth light-emitting layer and the sixth light-emitting layer are different from each other.

6. The display device according to claim 5, wherein the colors of the second light-emitting layer, the fourth light-emitting layer and the fifth light-emitting layer are different from each other, and the colors of the third light-emitting layer, the fifth light-emitting layer and the sixth light-emitting layer are different from each other.

7. The display device according to claim 5, wherein the colors of the first light-emitting layer and the fourth light-emitting layer are identical, the colors of the second light-emitting layer and the fifth light-emitting layer are identical, and the colors of the third light-emitting layer and the sixth light-emitting layer are identical.

8. The display device according to claim 1, wherein a vertical distance between the first light-emitting element and the fourth light-emitting element is from 3 micrometers to 5 micrometers.

9. The display device according to claim 1, wherein a material of the first pixel defining layer comprises a photo-resist material.

10. The display device according to claim 1, wherein the first light-emitting element, the second light-emitting element and the third light-emitting element are top-emission light-emitting elements, and the fourth light-emitting element, the fifth light-emitting element and the sixth light-emitting element are bottom-emission light-emitting elements.

11. The display device according to claim 1, wherein a gap is provided between the first light-emitting element and the fourth light-emitting element, between the second light-emitting element and the fifth light-emitting element and between the third light-emitting element and the sixth light-emitting element.

12. The display device according to claim 1, wherein the fourth light-emitting element, the fifth light-emitting element and the sixth light-emitting element are electrically connected with a second active element layer, wherein
the first active element layer comprises a plurality of first active elements, gates, drains and sources of the first active elements comprising a metal material, and
the second active element layer comprises a plurality of second active elements, gates, drains and sources of the second active elements comprising a transparent material.

* * * * *